United States Patent
Zhang et al.

(10) Patent No.: US 11,177,448 B2
(45) Date of Patent: Nov. 16, 2021

(54) FLEXIBLE DISPLAY DEVICE AND MANUFACTURING METHOD

(71) Applicant: BOE TECHNOLOGY GROUP CO., LTD., Beijing (CN)

(72) Inventors: Shuai Zhang, Beijing (CN); Yueping Zuo, Beijing (CN); Libin Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/611,110

(22) PCT Filed: Jan. 23, 2019

(86) PCT No.: PCT/CN2019/072797
§ 371 (c)(1),
(2) Date: Nov. 5, 2019

(87) PCT Pub. No.: WO2019/210712
PCT Pub. Date: Nov. 7, 2019

(65) Prior Publication Data
US 2020/0152894 A1    May 14, 2020

(30) Foreign Application Priority Data
May 2, 2018 (CN) .......................... 201810409491.3

(51) Int. Cl.
*H01L 51/56* (2006.01)
*H01L 51/00* (2006.01)
*H01L 27/32* (2006.01)

(52) U.S. Cl.
CPC ...... *H01L 51/0097* (2013.01); *H01L 27/3244* (2013.01); *H01L 51/003* (2013.01);
(Continued)

(58) Field of Classification Search
CPC .... H01L 51/0097; H01L 51/003; H01L 51/56
See application file for complete search history.

(56) References Cited

U.S. PATENT DOCUMENTS 6,388,334 B1* 5/2002 Birdsley ............... H01L 21/485
257/374
10,686,148 B2* 6/2020 Jang .................... H01L 27/1218
(Continued)

FOREIGN PATENT DOCUMENTS

| CN | 103531442 A | 1/2014 |
| CN | 104867872 A | 8/2015 |

(Continued)

OTHER PUBLICATIONS

Definition of "etching", Google.com (2020) (Year: 2020).*
(Continued)

*Primary Examiner* — Michele Fan
(74) *Attorney, Agent, or Firm* — Muncy, Geissler, Olds & Lowe, P.C.

(57) ABSTRACT

The present disclosure provides a flexible display device and a manufacturing method. The manufacturing method includes: forming a layer of flexible display devices on a support plate; etching the layer of flexible display devices on the support plate to expose a portion of the support plate at a cutting region, the cutting region being a predetermined region between two adjacent flexible display devices; and removing the layer of flexible display devices from the support plate after the etching process so as to obtain a plurality of flexible display devices separated from each other.

15 Claims, 2 Drawing Sheets

(52) U.S. Cl.
CPC ........ *H01L 51/56* (2013.01); *H01L 2227/326* (2013.01); *H01L 2251/5338* (2013.01)

(56) References Cited

U.S. PATENT DOCUMENTS

| | | | |
|---|---|---|---|
| 2007/0158656 A1* | 7/2007 | Lee | G02F 1/133305 257/72 |
| 2009/0057842 A1* | 3/2009 | He | H01L 22/32 257/620 |
| 2014/0131683 A1* | 5/2014 | Kim | H01L 51/5253 257/40 |
| 2014/0134763 A1* | 5/2014 | Park | H01L 51/0014 438/26 |
| 2017/0317299 A1 | 11/2017 | Choi et al. | |
| 2018/0033979 A1* | 2/2018 | Jang | B32B 15/09 |
| 2018/0102399 A1* | 4/2018 | Cho | H01L 27/3258 |
| 2018/0342707 A1* | 11/2018 | Lee | H01L 51/56 |
| 2019/0131569 A1 | 5/2019 | Ma et al. | |
| 2019/0252207 A1* | 8/2019 | Hsieh | H01L 21/4846 |
| 2019/0259967 A1* | 8/2019 | Yang | H01L 51/0023 |

FOREIGN PATENT DOCUMENTS

| | | |
|---|---|---|
| CN | 105977277 A | 9/2016 |
| CN | 107785505 A | 3/2018 |
| CN | 107833906 A | 3/2018 |
| CN | 107845737 A | 3/2018 |
| CN | 108400261 A | 8/2018 |
| JP | 2012051777 A | 3/2012 |

OTHER PUBLICATIONS

Office Action of CN Application No. 201810409491.3, dated Mar. 11, 2019, 6 pages.
International Search Report of PCT/CN2019/072797, dated Apr. 26, 2019, 9 pages.

* cited by examiner

FLEXIBLE DISPLAY DEVICE AND MANUFACTURING METHOD

CROSS-REFERENCE TO RELATED APPLICATION

This application is the U.S. national phase of PCT Application No. PCT/CN2019/072797 filed on Jan. 23, 2019, which claims priority to Chinese Patent Application No. 201810409491.3 filed on May 2, 2018, the disclosures of which are incorporated in their entirety by reference herein.

TECHNICAL FIELD

The present disclosure relates to the field of display technology, in particular to a flexible display device and a manufacturing method.

BACKGROUND

Currently, in order to improve the production efficiency of display devices and reduce the manufacture cost thereof, regardless of Thin Film Transistor Liquid Crystal Displays (TFT-LCDs) or Organic Light-Emitting Diode (OLED) display devices, a motherboard is formed integrally through several processes and divided, and then subsequent module manufacture processes are performed.

Taking the manufacture of a flexible display substrate including a flexible substrate as an example, the flexible substrate is formed on a support plate at first, and then a plurality of display devices is formed simultaneously, and arranged on the flexible substrate with high utilization rate, so as to form a flexible display substrate motherboard. Next, the flexible substrate is separated from the support plate through a laser lift off (LLO) process or any other appropriate separation process, a base layer is attached onto a surface of the flexible substrate away from the display element, and then a slicing process is performed so as to obtain flexible display substrates separated from each other. Usually, a cutting region between two adjacent display devices on the flexible display substrate motherboard is cut through a laser cutting process. However, due to a relatively high temperature of the laser cutting, usually a laser cutting operation is performed with certain distance from an edge of the display device, so as to prevent the display device from being adversely affected by the high temperature. In other words, it is necessary to provide a cutting margin for the laser cutting process. However, reserving the cutting margin is adverse to the design of an ultra-narrow bezel. Hence, through the conventional cutting method for the display device, it is impossible to provide the ultra-narrow bezel while ensuring the quality of the display device.

SUMMARY

In one aspect, the present disclosure provides in some embodiments a method for manufacturing a flexible display device, including: forming a plurality of flexible display devices on a support plate; etching the layer of flexible display devices on the support plate to expose a portion of the support plate at a cutting region, the cutting region being a predetermined region between two adjacent flexible display devices; and removing the layer of flexible display devices from the support plate after the etching process so as to obtain a plurality of flexible display devices separated from each other.

In a possible embodiment of the present disclosure, forming the layer of flexible display devices on the support plate includes: forming a flexible substrate on the support plate; and forming a plurality of layers on the flexible substrate. The cutting region is covered by the flexible substrate and the plurality of layers.

In a possible embodiment of the present disclosure, forming the plurality of layers on the flexible substrate includes forming an etch stop layer. The etch stop layer includes a first barrier pattern and a second barrier pattern arranged at two sides of the cutting region respectively to define an etching width.

In a possible embodiment of the present disclosure, the layer of flexible display devices on the support plate includes a bending region covered by the flexible substrate and the plurality of layers.

In a possible embodiment of the present disclosure, forming the plurality of layers on the flexible substrate includes forming a TFT array layer on the flexible substrate. The TFT array layer includes a gate electrode layer, a source electrode layer and a drain electrode layer.

In a possible embodiment of the present disclosure, forming the plurality of layers on the flexible substrate includes: forming the etch stop layer and the gate electrode layer of the TFT array layer through a single patterning process; or forming the etch stop layer and the source electrode layer and the drain electrode layer of the TFT array layer through a single patterning process.

In a possible embodiment of the present disclosure, the etch stop layer includes a first metal layer and a second metal layer. The step of forming the plurality of layers on the flexible substrate includes: forming the first metal layer of the etch stop layer and the gate electrode layer of the TFT array layer through a first patterning process; and forming the second metal layer of the etch stop layer and the source electrode layer and the drain electrode layer of the TFT array layer through a second patterning process.

In a possible embodiment of the present disclosure, prior to forming the TFT array layer on the flexible substrate, the method further includes forming a buffer layer on the flexible substrate.

In a possible embodiment of the present disclosure, forming the plurality of layers on the flexible substrate includes forming an organic material layer on the TFT array layer.

In a possible embodiment of the present disclosure, forming the plurality of layers on the flexible substrate includes forming an encapsulation layer on the organic material layer.

In a possible embodiment of the present disclosure, etching the layer of flexible display devices to expose the portion of the support plate at the cutting region includes etching off a portion of each layer and a portion of the flexible substrate, so as to expose the portion of the support plate at the cutting region.

In a possible embodiment of the present disclosure, etching the layer of flexible display devices on the support plate so as to expose the portion of the support plate at the cutting region includes removing a portion of the TFT array layer at the cutting region and a portion of the TFT array layer at the bending region through a single etching process.

In a possible embodiment of the present disclosure, subsequent to removing the portion of the TFT array layer at the cutting region and the portion of the TFT array layer at the bending region through a single etching process, the method further includes removing a portion of the buffer layer at the cutting region and a portion of the buffer layer at the bending region through a single etching process.

In a possible embodiment of the present disclosure, etching the layer of flexible display devices on the support plate so as to expose the portion of the support plate at the cutting region includes removing a portion of the organic material layer at the cutting region and a portion of the organic material layer at the bending region through an exposing process.

In a possible embodiment of the present disclosure, subsequent to the removing the portion of the buffer layer at the cutting region and the portion of the buffer layer at the bending region through a single etching process, the method further includes removing a portion of the encapsulation layer and a portion of the flexible substrate at the cutting region and a portion of the encapsulation layer at the bending region through a single etching process, so as to expose the portion of the support plate at the cutting region.

In a possible embodiment of the present disclosure, the flexible substrate includes a first flexible substrate, an isolation layer and a second flexible substrate laminated in turn. The removing the portion of the encapsulation layer and the portion of the flexible substrate at the cutting region and the portion of the encapsulation layer at the bending region through a single etching process includes removing the portion of the encapsulation layer at the cutting region, the portion of the encapsulation layer at the bending region, and a portion of each of the second flexible substrate, the isolation and the first flexible substrate at the cutting region through a single etching process.

In a possible embodiment of the present disclosure, removing the layer of flexible display devices from the support plate includes removing the layer of flexible display devices from the support plate after the etching process through a laser lift off process.

In another aspect, the present disclosure provides in some embodiments a flexible display device manufactured through the above-mentioned method.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

Figure 1A:
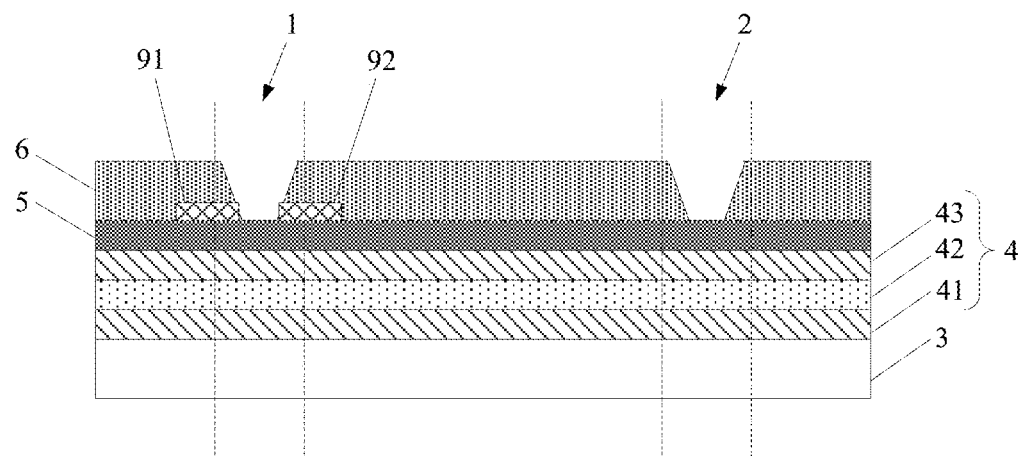
FIGS. 1a-1e are schematic views showing the manufacture of a flexible display device according to one embodiment of the present disclosure.

The present disclosure will be described hereinafter in conjunction with the embodiments and drawings.

As shown in FIGS. 1a to 1e, the present disclosure provides in some embodiments a method for manufacturing a flexible display device adapted to a mainstream manufacture process for the flexible display device. Generally, a flexible polyimide (PI) film is formed on a rigid substrate (usually a glass support plate), and then functional layers, e.g., a TFT layer, an OLED layer and an encapsulation layer, are formed on the PI film, so as to obtain the flexible display device.

Subsequent to the formation of a display panel including the above-mentioned functional layers on the PI film, the PI film may be removed from the glass support plate through an LLO process, so as to obtain the display panel with the PI film as a flexible substrate. Typically, during the LLO process, the flexible display panel is irradiated with a laser beam from a side where the glass support plate is located, so as to destroy an intermolecular force between the flexible PI substrate and the glass support plate, thereby to effectively separate the PI substrate from the glass support plate.

During the manufacture of the conventional flexible display device, usually a plurality of display devices manufactured as a whole is removed from the glass support plate, and then cut into the flexible display devices separated from each other through a laser cutting operation. As pointed out in the background, it is necessary to provide a certain cutting margin for the laser cutting process, so it is impossible to provide a product with an ultra-arrow bezel while ensuring the quality of the display device.

According to the method for manufacturing the flexible display device in the embodiments of the present disclosure, flexible display devices on a glass support plate may be separated from each other through an etching process, and each flexible display device may be individually attached onto the glass support plate.

According to the method for manufacturing the flexible display device in the embodiments of the present disclosure, it is unnecessary to cut a motherboard into individual display devices through a laser cutting process, therefore the cutting margin is no longer required for the laser cutting process. In addition, through the etching process, it is able to accurately define an etching width at a cutting region, thereby to improve the quality of the display device as well as the yield thereof. Furthermore, through the combination of the etching process and the manufacture process for the functional layers of the flexible display device, it is able to separate the display devices from each other without any additional process, thereby to reduce the manufacture cost.

During the manufacture of the flexible display device, a dry etching process and/or a wet etching process may be adopted for the etching process.

The method for manufacturing the flexible display device in the embodiments of the present disclosure is not limited to performing an etching and removing process after all the layers for the display device have been formed, so the term "flexible display device" intends to cover a completed display device having all the functional layers been formed or any existing functional layer of a display device which is still in a manufacturing process, unless a process state (or stage) has been specified.

The layers of the flexible display device will be described hereinafter in conjunction with the drawings. FIG. 1d shows a glass support plate 3 as a rigid substrate, a flexible substrate 4 formed on the glass support plate 3, a buffer layer 5 formed on the flexible substrate 4, a TFT array layer 6 formed on the buffer layer 5, an organic material layer 7 formed on the TFT array layer 6, and an encapsulation layer 8 formed at an outermost side of the respective layers. Between two adjacent flexible display devices is provided a cutting region 1 in advance for the subsequent etching process and cutting process.

In some embodiments of the present disclosure, subsequent to the formation of the flexible substrate 4, the buffer layer 5, the TFT array layer 6, the organic material layer 7 and the encapsulation layer 8 sequentially, i.e., after the manufacture of the flexible display devices, portions of the layers at the cutting region 1 between two adjacent flexible display devices may be removed through an etching process, so as to separate the flexible display devices on the glass support plate 3 from each other. At this stage, the separated flexible display devices are attached on the glass support plate 3 respectively.

Next, the layer of flexible display devices may be removed from the glass support plate 3 through any appropriate separation processes including, but not limited to, an LLO process, so as to obtain a plurality of flexible display devices separated from each other. Then, a base film may be attached onto the flexible substrate 4 of each flexible display device. In this way, the manufacture process of a flexible display device is completed. Any appropriate separation techniques or processes capable of removing the flexible substrate from the glass support plate may be adopted, and these separation processes may be combined with the etching process according to the embodiment of the present disclosure, so as to achieve a same or similar beneficial effect of the present disclosure, i.e., to provide the product with an ultra-narrow bezel while ensuring the quality of the display device.

As shown in FIG. 1d, the method may include: forming the layer of flexible display devices on the glass support plate 3; etching the layer of flexible display devices on the glass support plate 3 so as to expose a portion of the glass support plate 3 at the cutting region 1, the cutting region 1 being a predetermined region between two adjacent flexible display devices; and after the etching process is completed, removing the respective flexible display devices from the glass support plate 3 so as to obtain a plurality of flexible display devices separated from each other.

When etching the flexible display devices, it is necessary to etch a metal layer, an inorganic material and an organic material included in the plurality of layers through different etching processes, so as to finally expose the portion of the glass support plate 3 at the cutting region 1.

According to the method in the embodiments of the present disclosure, the layer of flexible display devices may be formed on the glass support plate 3 at first. Next, a portion of each layer at the cutting region 1 between two adjacent flexible display devices may be removed through an etching process, so as to separate the flexible display devices from each other. Finally, each etched flexible display device may be removed from the glass support plate 3 through an LLO process, so as to obtain a plurality of flexible display devices separated from each other. Hence, during the manufacture of the flexible display device using the method in the embodiments of the present disclosure, the display devices may be separated from each other through an etching process, and as compared with the related art where a laser cutting process is adopted, it is able to provide a smaller cutting width, and accurately control a bezel of each display device. In a word, through the method in the embodiments of the present disclosure, it is able to provide the product with an ultra-narrow bezel while ensuring the quality of the display device.

In some embodiments of the present disclosure, the process of removing the portion of each layer at the cutting region 1 through an etching process may be performed at any appropriate time according to the practical need. For example, the portion of each layer at the cutting region 1 may be removed through an etching process after the formation of the layer covering the cutting region 1. Also, the portions of at least two layers at the cutting region 1 may be removed through an etching process after the formation of the at least two layers covering the cutting region 1.

The etching process for separating the flexible display devices from each other may be performed after, or at the same time with, the process for forming each layer according to the practical need, as long as the portion of the glass support plate 3 at the cutting region 1 is exposed finally. In this regard, it is able to thoroughly separate the adjacent flexible display devices from each other without any laser cutting operation.

In the embodiments of the present disclosure, the etching process may also be performed during the manufacture of the flexible display devices, so as to simplify the manufacture process and reduce the manufacture cost.

As shown in FIGS. 1a-1d, the process of forming the layer of flexible display devices on the support plate may include: forming the flexible substrate 4 on the support plate; and forming the plurality of layers on the flexible substrate 4. The cutting region 1 between two adjacent flexible display devices may be covered by the flexible substrate 4 and the plurality of layers.

Here, the flexible substrate 4 may include a first flexible substrate 41, an isolation layer 42 and a second flexible substrate 43 laminated one on another.

In some embodiments of the present disclosure, each of the plurality of flexible display devices on the support plat may include a bending region 2 covered by the flexible substrate and the plurality of layers. For each flexible display device, the bending region may be a region where a portion of the display device is to be frequently bent. In some embodiments of the present disclosure, the TFT array layer and the organic material layer at the bending region may also be removed, with merely the flexible substrate being left. In other words, during the manufacture of the flexible display device having the bending region, it is necessary to etch the TFT array layer and the organic material layer on the flexible substrate 4. When the flexible display device includes the bending region 2, the layers at the bending region 2 also needs to be removed. Hence, it is able to remove the layers at the cutting region 1 and the layers at the bending region 2 through an etching process simultaneously, i.e., it is unnecessary to provide any additional etching process for removing the layers at the cutting region 1, thereby to reduce the manufacture cost.

Of course, it should be appreciated that, even when the flexible display device is not provided with the bending region, the etching process for separating the flexible display devices may also be adapted to the above-mentioned method and used to control the cutting width for the product with the ultra-narrow bezel. At this time, the etching process needs to be performed separately, or simultaneously with any step of etching the layers at a non-bending region during the manufacture of the flexible display device.

In some embodiments of the present disclosure, the step of forming the plurality of layers on the flexible substrate 4 may include forming the TFT array layer 6 on the flexible substrate. The TFT array layer 6 may include a gate electrode layer, a source electrode layer and a drain electrode layer.

The TFT array layer 6 may include a plurality of TFTs, and at least include the gate electrode layer, an inorganic layer, a semiconductor material layer, and a source/drain metal layer. During the manufacture of the TFT array layer 6, the inorganic layer may cover the entire flexible substrate 4 (including the cutting region 1 and the bending region 2), and the gate electrode layer and the source/drain metal layer may be formed at a display region and avoid the cutting region 1 and the bending region 2. In addition, when forming the source/drain metal layer, an etch stop pattern for the etching process may be formed outside the cutting region 1, which will be described hereinafter.

A portion of the inorganic layer at the cutting region 1 and a portion of the inorganic layer at the bending region 2 may be removed simultaneously through the etching process, so as to expose portions of the flexible substrate 4 at the cutting region 1 and the bending region 2.

In some embodiments of the present disclosure, prior to forming the TFT array layer 6 on the flexible substrate 4, the method may further include forming the buffer layer 5 on the flexible substrate 4.

When the buffer layer 5 is formed on the flexible substrate 4, a portion of the buffer layer 5 at the cutting region 1 may be removed in the following modes.

Figure 1B:
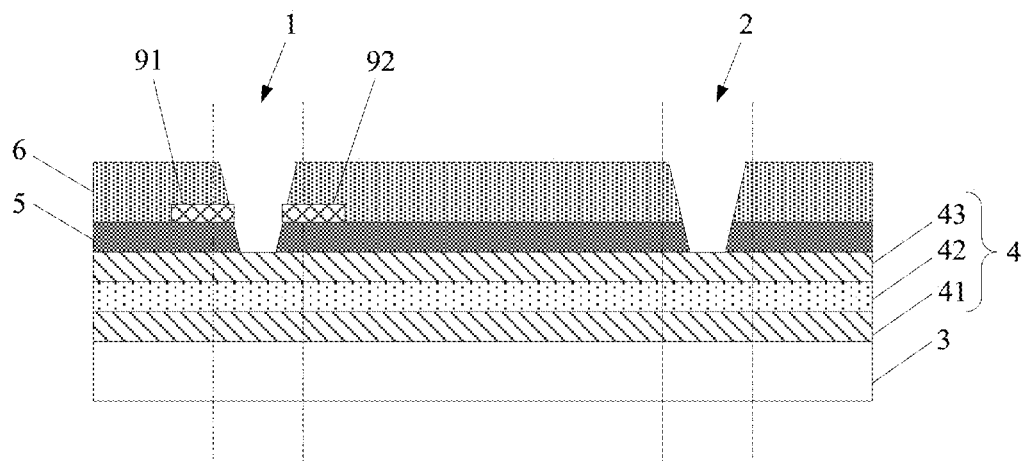
Figure 1C:
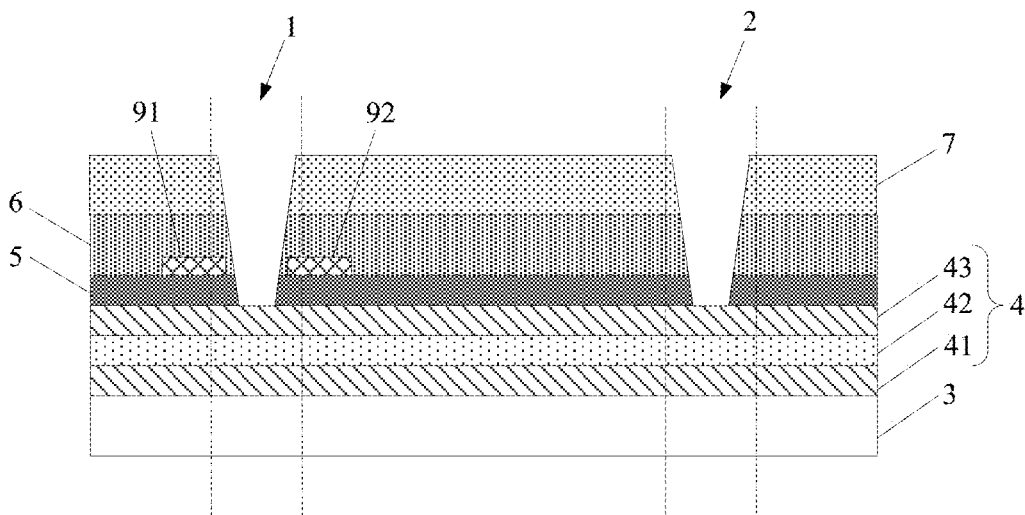
Figure 1D:
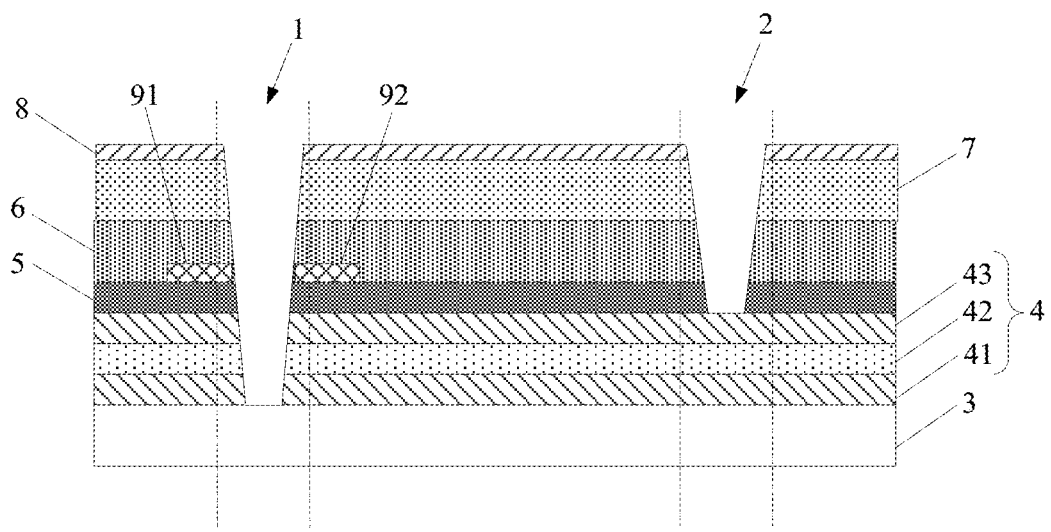
Figure 1E:
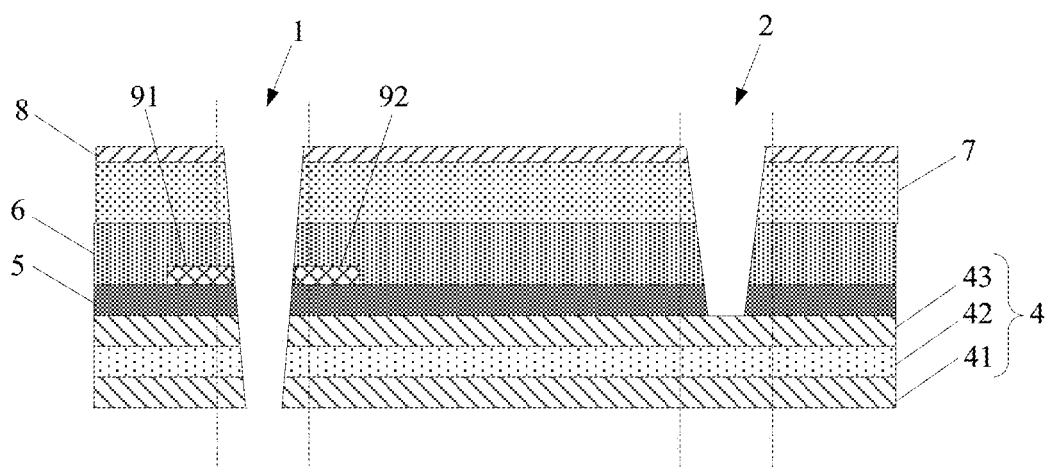

In a first mode, portions of the TFT array layer 6 and the buffer layer 5 at the cutting region 1 and the bending region 2 may be removed through a single etching process, as shown in FIG. 1*b*. In a second mode, after the removal of the portions of the TFT array layer 6 at the cutting region 1 and the bending region 2 through an etching process, the portions of the buffer layer 5 at the cutting region 1 and the bending region 2 may be removed through another etching process.

When the portion of the buffer layer 5 at the cutting region 1 is removed in the first mode, it is unnecessary to provide any additional etching process for removing the buffer layer 5, so it is able to simplify the separation of the adjacent flexible display devices from each other. When the buffer layer 5 is removed in the second mode, it is able to etch the portions of the TFT array layer 6 and the buffer layer 5 at the cutting region 1 and the bending region 2 with improved accuracy.

In some embodiments of the present disclosure, the step of forming the plurality of layers on the flexible substrate 4 may include forming the organic material layer 7 on the TFT array layer 6.

Usually, the organic material layer 7 may include a hole injection layer, a hole transport layer, a light emission layer, an electron transport layer and an electron injection layer. The hole injection layer, the hole transport layer, the electron transport layer and the electron injection layer may be called collectively as a common layer which covers the cutting region 1 and the bending region 2. The light emission layer may be formed at the display region and avoid the cutting region 1 and the bending region 2. A portion of the common layer at the cutting region 1 and a portion of the common layer at the bending region 2 may be removed simultaneously through an etching process, so as to expose the portions of the flexible substrate 4 at the cutting region 1 and the bending region 2.

The organic material layer 7 may be removed directly through exposing with a mask plate and cleansing with a developing liquid.

In some embodiments of the present disclosure, the step of forming the plurality of layers on the flexible substrate 4 may include forming the encapsulation layer 8 on the organic material layer 7.

Generally, subsequent to the formation of the functional layers of the flexible display device, the flexile display device may be encapsulated so as to prolong its service life. The encapsulation layer 8 may cover the cutting region 1 and the bending region 2. In order to expose the portions of the flexible substrate 4 at the cutting region 1 and the bending region 2, portions of the encapsulation layer 8 at the cutting region 1 and the bending region 2 may be removed through an etching process.

In some embodiments of the present disclosure, during the manufacture of the flexible display device, it is necessary to etch the layers at the bending region 2 twice. In order to reduce the number of the etching processes and reduce the manufacture cost, the layers at the cutting region 1 may be etched when etching the layers at the bending region 2 for the first time and the second time. For example, subsequent to the formation of the buffer layer 5 and the TFT array layer 6 on the flexible substrate 4, a first etching process at the cutting region 1 may be performed at the same time with a first etching process at the bending region, so as to remove the portion of the TFT array layer 6 at the cutting region 1, thereby to expose the buffer layer 5.

Next, a second etching process at the cutting region 1 may be performed at the same time with a second etching process at the bending region 2, so as to remove the portion of the buffer layer 5 at the cutting region 1, thereby to expose the flexible substrate 4 under the buffer layer 5.

The step of forming the organic material layer 7 on the TFT array layer 6 may be performed between the first etching process and the second etching process, i.e., the organic material layer 7 may be formed after removal of the portion of the TFT array layer 6 at the cutting region 1 and exposure of the buffer layer 5. Otherwise, the organic material layer 7 may be formed after the second etching process, i.e., after the removal of the portion of the buffer layer 5 at the cutting region 1.

During the manufacture process of the display device, the portion of the organic material layer 7 at the cutting region 1 may be removed through exposing with a mask plate, so the step of forming the organic material layer 7 may be performed at any appropriate time according to the practical need.

The step of forming the encapsulation layer 8 may be performed after the second etching process.

After the second etching process at the bending region 2, the etching treatment at the bending region 2 may be completed. Next, it is necessary to further etch the layers at the cutting region 1. For example, the portions of the encapsulation layer 8 and the flexible substrate 4 may be removed through a single etching process, so as to expose the portion of the glass support plate 3 at the cutting region 1. At this time, the flexible display devices have been separated from each other, and each flexible display device is attached onto the glass support plate 3. Then, each display device with a narrow bezel can be removed from the glass support plate through an LLO process.

Further, in order to etch the layers such as the TFT array layer and the organic material layer on the flexible substrate 4, it is necessary to provide an etch stop layer. In some embodiments of the present disclosure, the etch stop layer may include a first barrier pattern 91 and a second barrier pattern 92 arranged at two sides of the cutting region respectively to define the etching width. To be specific, during the formation of the layers of the flexible display device, the etch stop layer including the first barrier pattern 91 and the second barrier pattern 92 may be formed at the two sides of the cutting region 1 respectively, so as to accurately define the etching width for the etching operation at the cutting region 1. In this way, it is able to prevent the layers at a region other than the cutting region 1 from being etched off, thereby to etch the layers at the cutting region 1 accurately.

In some embodiments of the present disclosure, the manufacture method may further include: forming the etch stop layer and the gate electrode layer of the TFT array layer 6 through a single patterning process; or forming the etch stop layer and the source electrode layer and the drain electrode layer of the TFT array layer 6 through a single patterning process.

In the embodiments of the present disclosure, the etch stop layer may be a single-layered metal layer, and it may be formed through a single patterning process with the gate electrode layer of the TFT array layer 6, or with the source electrode layer and the drain electrode layer of the TFT array layer 6. In this way, it is able to form the etch stop layer without any additional patterning process, thereby to reduce the manufacture cost.

In some embodiments of the present disclosure, each of the first barrier pattern 91 and the second barrier pattern 92 of the etch stop layer may include at least two metal layers laminated one on another. For example, the etch stop layer may include a first metal layer and a second metal layer. the step of forming the plurality of layers on the flexible substrate may include: forming the first metal layer of the etch stop layer and the gate electrode layer of the TFT array layer through a first patterning process; and forming the second metal layer of the etch stop layer and the source electrode layer and the drain electrode layer of the TFT array layer through a second patterning process.

When each of the first barrier pattern 91 and the second barrier pattern 92 includes at least two metal layers laminated one on another, the at least two metal layers may be formed through a same process with the metal layers of the TFT array layer 6. For example, one of the at least two metal layers may be formed through a same patterning process with the gate electrode layer of the TFT array layer 6, and the other may be formed through a same patterning process with the source electrode layer and the drain electrode layer of the TFT array layer 6. In addition, each of the at least two layers may also be formed through a same patterning process with such components as gate lines, data lines and an anode layer of the TFT array layer 6, which will not be particularly defined herein.

It should be appreciated that, in order to prevent the flexible display device from being adversely affected by the etch stop layer, the etch stop layer may have a width in a direction perpendicular to the cutting region 1 as small as possible. For example, the width of the etch stop layer in the direction perpendicular to the cutting region 1 may be smaller than 10 μm, or smaller than 5 μm.

Subsequent to forming the etch stop layer, the method may further include forming a protection layer on the etch stop layer.

To be specific, subsequent to the formation of the etch stop layer, a protection layer may be formed on the etch stop layer. The protection layer may be made of a colloid material. When the etch stop layer is covered by the protection layer, it is able to prevent the etch stop layer from being adversely affected during the etching, thereby to ensure the etching accuracy in a better manner.

The present disclosure further provides in some embodiments a flexible display device manufactured through the above-mentioned method.

According to the embodiments of the present disclosure, the layer of flexible display devices may be formed on the support plate, and the portions of the layers at the cutting region between two adjacent flexible display devices may be removed through an etching process, so as to separate the display devices from each other. Then, the etch flexible display devices may be removed from the support plate through an LLO process, so as to obtain the flexible display devices separated from each other. During the manufacture of the flexible display devices, the flexible display devices may be separated from each other through an etching process, so it is unnecessary to provide a cutting margin at an external region of each flexible display device, and as compared with a conventional laser cutting process, it is able to provide a smaller cutting width, thereby to facilitate the design of an ultra-narrow bezel. In a word, during the manufacture of the flexible display device in the embodiments of the present disclosure, it is able to provide the product with the ultra-narrow bezel while ensuring the quality of the display device.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the embodiments of the present disclosure, the features, structures or materials may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing a flexible display device, comprising:
    forming a layer of flexible display devices on a support plate;
    etching the layer of flexible display devices on the support plate to expose a portion of the support plate at a cutting region, the cutting region being a predetermined region between two adjacent flexible display devices; and
    removing the layer of flexible display devices from the support plate after the etching process, so as to obtain a plurality of flexible display devices separated from each other,
    wherein forming the layer of flexible display devices on the support plate comprises:
    forming a flexible substrate on the support plate; and
    forming a plurality of layers on the flexible substrate, wherein the cutting region is covered by the flexible substrate and the plurality of layers;
    wherein each of the plurality of flexible display devices on the support plate comprises a bending region covered by the flexible substrate and the plurality of layers;
    wherein forming the plurality of layers on the flexible substrate comprises forming a Thin Film Transistor (TFT) array layer on the flexible substrate, wherein the TFT array layer comprises a gate electrode layer, a source electrode layer and a drain electrode layer;
    wherein etching the layer of flexible display devices on the support plate so as to expose the portion of the support plate at the cutting region comprises removing a portion of the TFT array layer at the cutting region and a portion of the TFT array layer at the bending region through a single etching process.

2. The method according to claim 1, wherein forming the plurality of layers on the flexible substrate comprises:
forming an etch stop layer, wherein the etch stop layer comprises a first barrier pattern and a second barrier pattern arranged at two sides of the cutting region respectively to define an etching width.

3. The method according to claim 2, wherein forming the plurality of layers on the flexible substrate comprises:
forming the etch stop layer and the gate electrode layer of the TFT array layer through a single patterning process; or
forming the etch stop layer and the source electrode layer and the drain electrode layer of the TFT array layer through a single patterning process.

4. The method according to claim 2, wherein the etch stop layer comprises a first metal layer and a second metal layer, and
forming the plurality of layers on the flexible substrate comprises:
forming the first metal layer of the etch stop layer and the gate electrode layer of the TFT array layer through a first patterning process; and
forming the second metal layer of the etch stop layer and the source electrode layer and the drain electrode layer of the TFT array layer through a second patterning process.

5. The method according to claim 2, wherein prior to forming the TFT array layer on the flexible substrate, the method further comprises forming a buffer layer on the flexible substrate.

6. The method according to claim 2, wherein each of the plurality of flexible display devices on the support plate comprises a bending region covered by the flexible substrate and the plurality of layers.

7. The method according to claim 1, wherein forming the plurality of layers on the flexible substrate comprises forming an organic material layer on the TFT array layer.

8. The method according to claim 7, wherein forming the plurality of layers on the flexible substrate comprises forming an encapsulation layer on the organic material layer.

9. The method according to claim 8, wherein etching the layer of flexible display devices to expose the portion of the support plate at the cutting region comprises etching off a portion of the plurality of layers and a portion of the flexible substrate, so as to expose the portion of the support plate at the cutting region.

10. The method according to claim 7, wherein etching the layer of flexible display devices on the support plate so as to expose the portion of the support plate at the cutting region comprises removing a portion of the organic material layer at the cutting region and a portion of the organic material layer at the bending region through an exposing process.

11. The method according to claim 1, wherein subsequent to removing the portion of the TFT array layer at the cutting region and the portion of the TFT array layer at the bending region through a single etching process, the method further comprises removing a portion of the buffer layer at the cutting region and a portion of the buffer layer at the bending region through a single etching process.

12. The method according to claim 11, wherein subsequent to the removing the portion of the buffer layer at the cutting region and the portion of the buffer layer at the bending region through a single etching process, the method further comprises removing a portion of the encapsulation layer and a portion of the flexible substrate at the cutting region and a portion of the encapsulation layer at the bending region through a single etching process, so as to expose the portion of the support plate at the cutting region.

13. The method according to claim 12, wherein the flexible substrate comprises a first flexible substrate, an isolation layer and a second flexible substrate laminated in turn, wherein the removing the portion of the encapsulation layer and the portion of the flexible substrate at the cutting region and the portion of the encapsulation layer at the bending region through a single etching process comprises removing the portion of the encapsulation layer at the cutting region, the portion of the encapsulation layer at the bending region, and a portion of each of the second flexible substrate, the isolation and the first flexible substrate at the cutting region through a single etching process.

14. The method according to claim 1, wherein removing the layer of flexible display devices from the support plate after the etching process comprises removing the layer of flexible display devices from the support plate through a laser lift off process.

15. A flexible display device manufactured through the method according to claim 1.

* * * * *